(12) United States Patent
Brault et al.

(10) Patent No.: US 8,617,413 B2
(45) Date of Patent: Dec. 31, 2013

(54) METHOD AND DEVICE FOR ENCAPSULATING MICROSTRUCTURES

(75) Inventors: Sebastien Brault, Marcoussis (FR); Elisabeth Dufour-Gergam, Fontenay aux Roses (FR); Martial Desgeorges, Marcoussis (FR)

(73) Assignee: KFM Technology, Villebon sur Yvette (FR)

( * ) Notice: Subject to any disclaimer, the term of this patent is extended or adjusted under 35 U.S.C. 154(b) by 223 days.

(21) Appl. No.: 13/056,796

(22) PCT Filed: Jul. 31, 2009

(86) PCT No.: PCT/FR2009/051544
§ 371 (c)(1),
(2), (4) Date: Mar. 25, 2011

(87) PCT Pub. No.: WO2010/012966
PCT Pub. Date: Feb. 4, 2010

(65) Prior Publication Data
US 2011/0165365 A1  Jul. 7, 2011

(30) Foreign Application Priority Data
Aug. 1, 2008  (FR) ...................................... 08 55357

(51) Int. Cl.
*C03C 15/00* (2006.01)
(52) U.S. Cl.
USPC .............. 216/83; 438/64; 438/106; 438/112; 438/124
(58) Field of Classification Search
None
See application file for complete search history.

(56) References Cited

U.S. PATENT DOCUMENTS

| | | | | |
|---|---|---|---|---|
| 3,286,312 A | * | 11/1966 | Davis et al. | 249/134 |
| 2007/0231943 A1 | | 10/2007 | Ouellet et al. | |
| 2008/0061458 A1 | * | 3/2008 | Park et al. | 264/1.32 |

OTHER PUBLICATIONS

Jourdain A et al: "Optimization of O-level packaging for rf-mems devices", 12th International Conference on Solid State Sensors, Actuators and Microsystems, IEEE, vol. 2, Jun. 9, 2003, pp. 1915-1918, XP010647489.
Seok S et al: "Packaging methodology for RF devices using a BCB membrane transfer technique", Journal of Micromechanics & Microengineering, Institute of Physics Publishing, Bristol, GB, vol. 16, No. 11, Nov. 1, 2006, pp. 2384-2388, XP020104816.
International Search Report, dated Jan. 1, 2010, in PCT/FR2009/051544.
French Search Report, dated Apr. 6, 2009, in Application No. FA 710950/FR 0855357.

\* cited by examiner

*Primary Examiner* — Lan Vinh
*Assistant Examiner* — Jiong-Ping Lu
(74) *Attorney, Agent, or Firm* — Young & Thompson

(57) ABSTRACT

A method for encapsulating structures (11) (typically MEMS structures) supported by a carrier substrate (12) (typically made of glass or silicon), includes: application, on the carrier substrate (12), of at least one cover (7) supported by a mould (1, 2, 6), the mould including a catching layer (6), each cover (7) being in contact with the catching layer (6); then fastening of at least one cover (7) onto the carrier substrate (12); and then separation of the mould (1, 2, 6) from the at least one cover (7). The catching layer (6) includes a fluoropolymer. Preferably, the mould (1, 2, 6) is mechanically separated from the at least one cover (7), by pulling the mould (1, 2, 6) away from the at least one cover (7). Thus, the mould (1) can be reused, which considerably simplifies encapsulating operations carried out on an industrial scale.

11 Claims, 3 Drawing Sheets

METHOD AND DEVICE FOR ENCAPSULATING MICROSTRUCTURES

TECHNICAL FIELD

Figure 1:
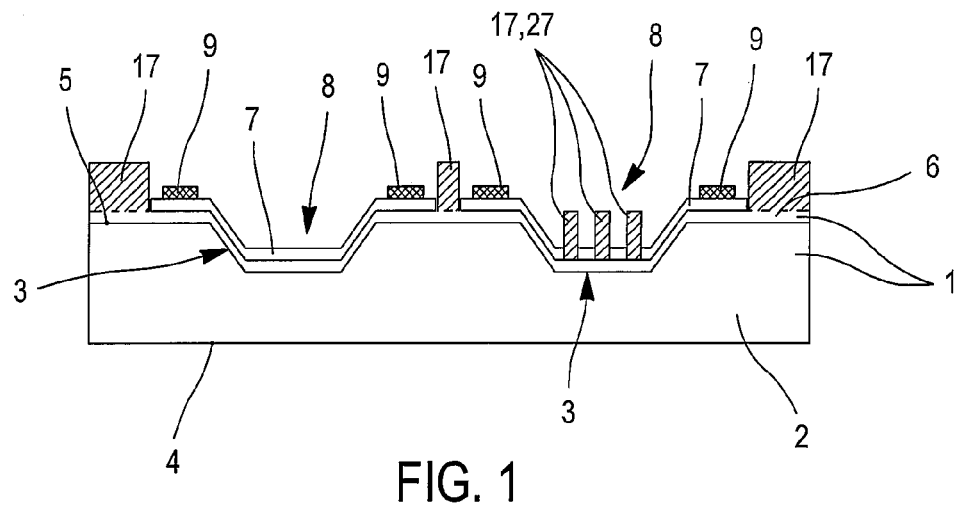

The present invention relates to a method and device for encapsulating, individually or collectively, structures carried by a substrate. It also relates to an encapsulation mould for such a method or device, and a method for producing such a mould.

The field of the invention is more particularly, but not limitatively, that of the encapsulation of microsystems on a glass or silicon substrate.

STATE OF THE PRIOR ART

In all fields, the packaging stage represents the final stage in the manufacturing of a product. The packaging of microelectromechanical systems (MEMS or "Micro Electro Mechanical Systems") is complex, as MEMS comprise mechanical parts, generally deformable or mobile, that are very sensitive to liquids and in general to their environment.

In many cases, microsystems must be protected from the external environment in a cavity sealed against moisture and gases so as to limit their aging and increase their reliability. The creation of this cavity allowing the encapsulation of the microsystem is also called "Packaging". The packaging stage has now become as important as the production method for microsystems.

In the 1980s, a novel approach was developed: wafer-level encapsulation (or WLP for "Wafer-Level Packaging") allows for collective and simultaneous encapsulation of all microsystems present on a carrier substrate.

The ultimate purpose of encapsulating MEMS in a cavity is to protect them from the environment outside the cavity and to ensure the stability and reliability of their performance. In order to achieve this purpose, the encapsulation must generally provide some or all of the following functions:
- mechanical protection of the MEMS against the scratches, impacts and vibrations that may occur during their testing, handling, transportation or use;
- chemical protection of the MEMS against corrosion, contamination and moisture by means of the stability and inertia of the environment inside the cavity;
- a passage for connections (generally electrical connections) between the microsystems and the environment outside the cavity;
- thermal management of the devices, i.e. particularly heat protection.

A drawback of the existing methods of encapsulation is that they are very complex and cumbersome to implement. In particular, each encapsulation generally requires the production of a mould that must be completely dissolved during encapsulation.

The purpose of the present invention is to provide a method and a device for encapsulation that is simpler and/or more efficient than those of the state of the art.

DISCLOSURE OF THE INVENTION

This objective is achieved with a method for encapsulating at least one structure carried by a carrier substrate, comprising:
- applying onto the carrier substrate, at least one cap carried by a mould, the mould comprising an adhesion layer, each cap being in contact with the adhesion layer, then bonding the at least one cap onto the carrier substrate, then separating the mould and the at least one cap, characterized in that the adhesion layer is produced from a fluorinated polymer, and therefore comprises the fluorinated polymer.

By fluorinated polymer is meant, throughout this document, a polymer containing fluorine atoms. According to the invention, the fluorinated polymer preferably comprises at least one carbonated chain and along this chain several links of the C—F type between a carbon atom C and a fluorine atom F, as is the case in a fluorocarbon polymer. The fluorinated polymer preferably, but not limitatively, comprises Teflon. The fluorinated polymer preferably comprises a fluorocarbon polymer such as:
- Teflon of the PTFE type, also called polytetrafluoroethylene,
- Teflon of the FEP-type, also called fluorinated ethylene propylene,
- Teflon of the PFA-type, also called perfluoroalkoxy,
- PVDF, also called polyvinylidene fluoride,
- ETFE, also called modified ethylene and tetrafluoroethylene copolymer, and
- ECTFE, also called ethylene chlorotrifluoroethylene.

In a first embodiment of the encapsulation method according to the invention, it is possible to separate the mould and the at least one cap mechanically, by pulling the mould from the at least one cap. The mould preferably comprises a mould substrate in contact with the adhesion layer, and the break-away force required to separate the mould substrate and the adhesion layer is preferably greater than the break-away force required to separate the adhesion layer and the at least one cap.

In a second embodiment of the encapsulation method according to the invention, the mould can be separated from the at least one cap chemically, by dissolving the adhesion layer. It is possible for example to dissolve the adhesion layer in an acid bath or in a solvent bath, for example in a nitric acid bath.

In the encapsulation method according to the invention, the at least one cap is preferably bonded to the carrier substrate using a polymer seal or eutectic seal situated between the at least one cap and the carrier substrate, or using a thermocompression weld. When applying the at least one cap, the seal can be structured at the level of at least one passage for a connection linked to the at least one structure. Moreover, the at least one cap can be perforated, and can comprise one or more holes of various shapes and sizes. These holes are particularly useful in the case where the cap encapsulates an optical structure such as a light detector or an acoustic structure such as a microphone.

The mould preferably includes silicon atoms. Thus, the mould can adhere to the fluorinated polymer due to its silicon atom content, in particular via Si—C bonds between silicon atoms of the mould and carbon atoms of the fluorocarbon polymer.

Each cap can comprise a metallic layer in contact with the fluorinated polymer.

The invention also relates to an encapsulated structure obtained by the encapsulation method according to the invention.

According to yet another aspect of the invention, a device is proposed for the encapsulation of at least one structure carried by a carrier substrate, implementing a method according to the invention and comprising:
- a mould comprising an adhesion layer and carrying at least one cap such that each cap is in contact with the adhesion layer, means for applying, onto the carrier substrate, the at least one cap carried by the mould, means for bonding onto the carrier substrate the at least one cap applied onto the carrier substrate, means for separating the mould and the at least one cap bonded to the carrier substrate, characterized in that the adhesion layer comprises a fluorinated polymer.

The fluorinated polymer preferably comprises a fluorocarbon polymer, and more particularly preferably polytetrafluoroethylene.

In a first embodiment of the device according to the invention, the separation means can comprise means for mechanically separating the mould and the at least one cap, arranged in order to pull the mould from the at least one cap. The mould can then comprise a mould substrate in contact with the adhesion layer, and the break-away force required in order to separate the mould substrate and the adhesion layer is preferably greater than the break-away force required in order to separate the adhesion layer and the at least one cap.

In a second embodiment of the device according to the invention, the separation means can comprise means for chemically separating the mould and the at least one cap, arranged in order to dissolve the adhesion layer. The chemical separation means can for example comprise an acid bath or a solvent bath, in particular a nitric acid bath.

The bonding means can comprise means for welding a polymer seal or a eutectic seal located between the at least one cap and the carrier substrate, or thermocompression welding means. The seal can comprise at least one portion structured for at least one passage of a connection linked to the at least one structure.

Moreover, the at least one cap can be perforated, as described above.

The mould can comprise silicon atoms.

Each cap can comprise a metallic layer in contact with the fluorinated polymer.

The invention also relates to an encapsulation mould for an encapsulation device according to the invention and for an encapsulation method according to the invention, said mould comprising:

a mould substrate comprising at least one mould cavity,
an adhesion layer deposited on one face of the mould substrate carrying the at least one mould cavity,
characterized in that the adhesion layer comprises a fluorinated polymer.

The fluorinated polymer preferably comprises a fluorocarbon polymer, and more particularly preferably polytetrafluoroethylene.

The mould substrate can comprise silicon atoms.

The mould according to the invention can carry a cap on the adhesion layer, in each mould cavity. Each cap preferably comprises a metallic layer in contact with the fluorinated polymer. The break-away force required to separate the mould substrate and the adhesion layer is preferably greater than the break-away force required to separate the adhesion layer and the at least one cap. At least one of the caps can be perforated as described above.

In general, the invention relates to a mould obtained by a method for producing a mould according to the invention.

The invention also relates to a method for producing an encapsulation mould according to the invention, comprising:

etching a mould substrate, in order to form at least one mould cavity,
depositing an adhesion layer onto a face of the mould substrate carrying the at least one mould cavity, characterized in that the adhesion layer comprises a fluorinated polymer.

The fluorinated polymer preferably comprises a fluorocarbon polymer, and particularly preferably polytetrafluoroethylene.

After the deposition of the adhesion layer, the mould substrate can comprise silicon atoms.

The mould production method according to the invention can moreover comprise depositing a cap onto the adhesion layer, in each mould cavity. Each cap can comprise a metallic layer in contact with the fluorinated polymer. The break-away force required in order to separate the mould substrate and the adhesion layer is preferably greater than the break-away force required to separate the adhesion layer and the at least one cap. At least one of the caps can be perforated as described above.

The deposition of the adhesion layer preferably comprises exposing the mould substrate to a $C_4F_8$ plasma (this compound comprising four carbon atoms for eight fluorine atoms) such as octafluorobutene, perfluorobutene, octafluorocyclobutane or other.

BRIEF DESCRIPTION OF THE DRAWING FIGURES

Figure 2:
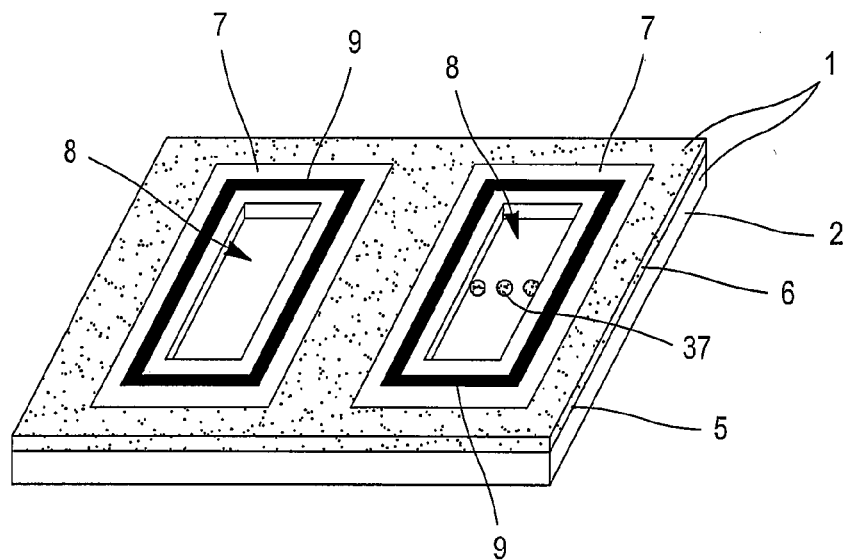
Figure 3:
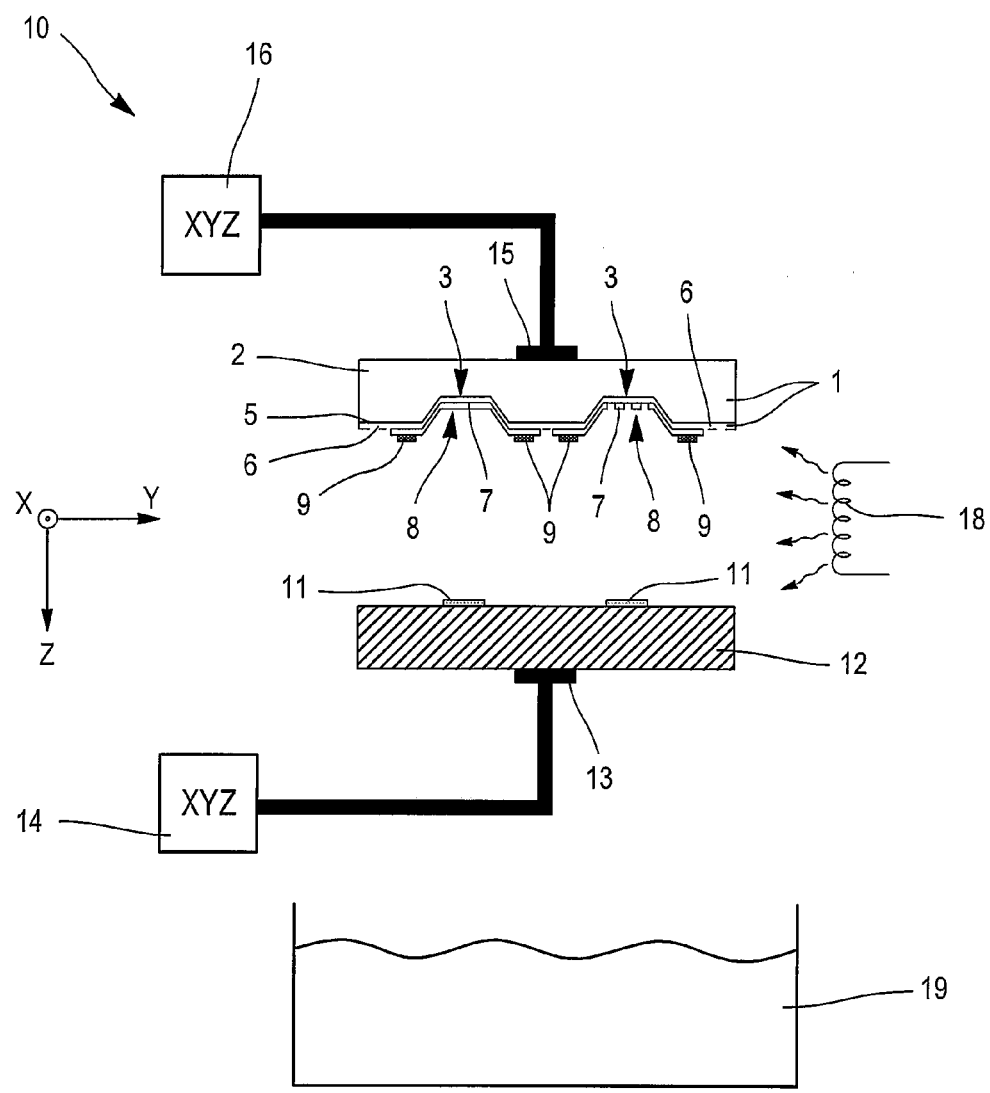

Other advantages and characteristics of the invention will become apparent on reading the detailed description of implementations and embodiments which are in no way limitative, and from the attached diagrams as follows:

FIG. 1 is a cross-sectional profile view of a mould according to the invention for an encapsulation device according to the invention, FIG. 2 is a three-quarter view of the mould in FIG. 1, FIG. 3 is a diagrammatic view of a first preferred embodiment of the encapsulation device according to the invention, comprising the mould in FIGS. 1 and 2, FIGS. 4 to 6 illustrate a mould, caps, and a carrier substrate of the device in FIG. 3 for different stages of an encapsulation method according to the invention.

DETAILED DESCRIPTION OF THE INVENTION

A description will firstly be given, with reference to FIGS. 1 and 2, of a mould 1 according to the invention for an encapsulation device and method according to the invention and a production method according to the invention for producing such a mould 1.

The production method comprises the chemical etching of a mould substrate 2 initially having the form of a plate with parallel faces 4, 5. The mould substrate 2 is etched in order to form at least one mould cavity 3 on one of these parallel faces 5. The mould substrate 2 is typically a wafer made of glass or silicon This etching is carried out by an etching method that is usual in the field of lithography, and comprises for example drawing a pattern on the face 5 of the mould substrate 2 using a mask. Thus, etching the mould is carried out:

by wet etching (for example using an etching solution of KOH, EDP, TMAH, etc.), in which case the areas not protected by the $Si_3N_4$ or $SiO_2$ mask are etched, or by dry etching (for example of the "DRIE" type), in which case the mask can be a photosensitive resin, an $SiO_2$ mask, or a layer of aluminium.

After the etching, an adhesion layer 6 is deposited on the face 5 of the mould substrate 2 carrying the at least one mould cavity 3. The adhesion layer 6 is made from a fluorinated polymer, and therefore comprises said fluorinated polymer.

By fluorinated polymer is meant a polymer comprising fluorine atoms. The fluorinated polymer here comprises a carbonated chain and along this chain several bonds of the C—F type between a carbon atom C and a fluorine atom F. The adhesion layer is shown by dotted lines on the cross-sectional views in FIGS. 1 and 3 to 6, and is shown as a layer filled with small dots in FIG. 2. The fluorinated polymer comprises a fluorocarbon polymer, and more particularly comprises polytetrafluoroethylene (or "PTFE") having the general chemical formula:

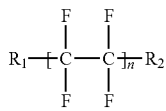

where:
- n is an integer, typically comprised between 1 and an almost infinite number equal to several thousand, several million or more, and
- the groups $R_1$ and $R_2$ comprise for example atoms of carbon C, oxygen O, fluorine F and/or other and therefore comprise for example CF, $CH_3$, $CF_3$ groups, or other.

The deposition of the adhesion layer comprises exposure of the mould substrate 2 to a $C_4F_8$ plasma in an RIE (Reactive Ion Etching) chamber or in a DRIE (Deep Reactive Ion Etching) chamber.

The thickness of this adhesion layer is comprised between several nanometres and several micrometres. The contact angle between a drop of deionized water and the adhesion layer 6 has a value comprised between 100° and 115°.

Then, thick resin lithography 17 is carried out on the mould 1, more particularly on the adhesion layer 6. The resin 17 is shown only in FIG. 1, and not in FIG. 2.

Then, several caps 7 are deposited onto the mould 1, more particularly onto the adhesion layer 6, a cap 7 being deposited in each mould cavity 3, such that each cap 7 adopts the shape of a mould cavity 3 and thus has the form of a cap cavity 8. Each cap 7 has the form of a plate of substantially constant thickness forming a cap cavity 8. The deposition of the caps 7 comprises a stack of films. The films are metallic films such as nickel, copper, and/or titanium films. Specifically, a thin titanium film is deposited on the mould substrate 2 using an evaporator or a spray, then a thin copper film using an evaporator or a spray, then a thick nickel film using an electrochemical bath, in succession one film over the other. The thick nickel film is thus facing the inside (i.e. the concave side) of each cap cavity 8 with respect to the other films, and constitutes the mass of each cap, i.e. most of the material of each cap.

The pattern of the resin 17 deposited during the thick resin lithography makes it possible to define the shape and size of each cap 7, and to separate the caps 7 from each other. The pattern of the resin 17 is not necessarily continuous: in particular, the pattern of the resin 17 can comprise isolated parts 27 located in at least one of the mould cavities 3.

The adhesion layer 6 is a layer that is non-adherent with respect to the caps. In other words, the adhesion between the mould substrate 2 and the adhesion layer 6 is greater than the adhesion between the adhesion layer 6 and the caps 7. The mould substrate 2 made of glass or silicon comprises silicon atoms that are in direct contact mainly with the carbon atoms of the fluorocarbon polymer 6. Thus, the mould can adhere to the fluorinated polymer due to its silicon atom content, in particular via Si—C bonds between silicon atoms of the mould and carbon atoms of the fluorocarbon polymer. Each cap 7 comprises a metallic layer made of titanium that is in direct contact mainly with the fluorine atoms of the fluorocarbon polymer. The break-away force required to separate the mould substrate 2 and the adhesion layer 6 is greater than the break-away force required to separate the adhesion layer 6 and each cap 7. This phenomenon is even more pronounced due to the use of $C_4F_8$ plasma to produce the adhesion layer 6.

Then, the resin 17 is removed, for example by dissolving it. FIG. 2 shows the mould 1 after dissolution of the resin 17. After dissolution of the isolated parts 27, at least one mould is obtained that is provided with holes 37 through which the adhesion layer 6 appears.

Finally, for each cap 7, a seal 9 is deposited:
- that is located on the cap 7 in question, on the opposite side of the cap 7 with respect to the adhesion layer 6, and
- that surrounds the cavity 8 of the cap 7 in question.

In a variant, the seals 9 are eutectic seals, comprising an alloy the melting point of which is less than that of each of its constituent elements. This alloy consists for example of a silicon-gold alloy.

In another variant, the seals 9 comprise a polymer seal comprising, for example benzo-cyclo-butene (BCB) or an epoxy resin, particularly of the SU8 type.

The encapsulation mould 1 resulting from the production method is shown in FIGS. 1 and 2, and comprises:
- the mould substrate 2 made of glass or silicon, comprising several mould cavities 3,
- is the adhesion layer 6 deposited on the face 5 of the mould substrate 2 carrying the mould cavities, this adhesion layer comprising a fluorinated polymer comprising polytetrafluoroethylene.

The mould 1 is common to several caps 7. The mould 1 carries a cap 7 on the adhesion layer 6 in each mould cavity 3, so that each cap 7 is in direct contact with the adhesion layer 6 and is connected to the mould 1 via the adhesion layer. The caps 7 are separated, i.e. they are not directly connected to each other, but only via the mould 1.

Finally, for each cap 7, the mould carries the above-described seal 9.

It is noted that in FIGS. 1-6, the mould 1 comprises only two cap cavities 8 and can carry only two caps 7. It will be understood that the sole purpose of this representation is to simplify and clarify these figures, as the mould 1 typically comprises several tens, hundreds, thousands or more cap cavities 8 such that it is arranged in order to carry the same number of caps 7.

Figure 4:
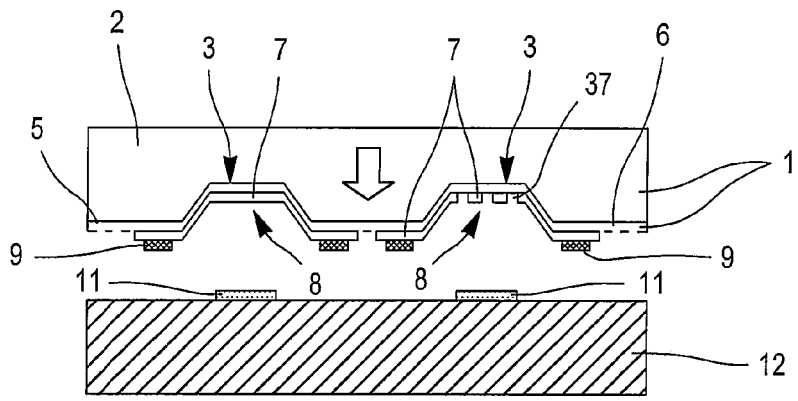
Figure 5:
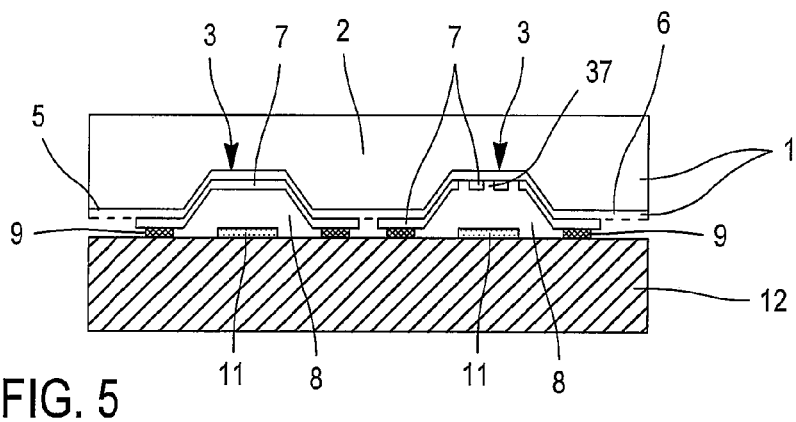
Figure 6:
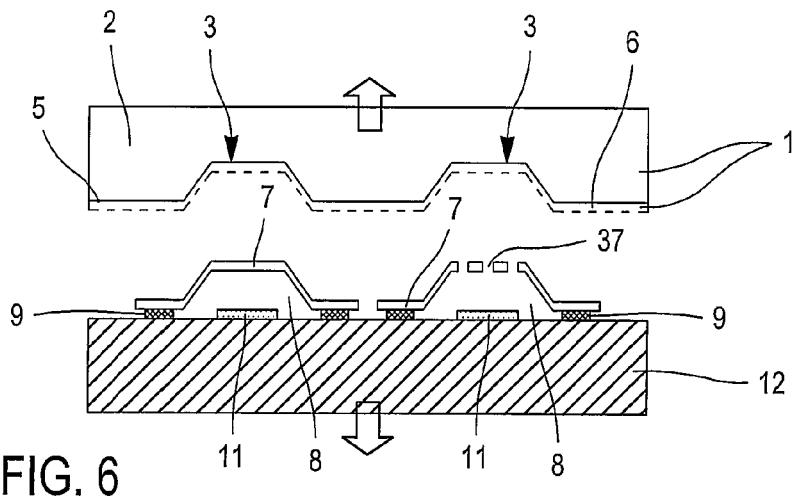

With reference to FIGS. 3 to 6, a first preferred embodiment of an encapsulation device 10 according to the invention, implementing a first preferred embodiment of the encapsulation method according to the invention, will now be described. FIG. 3 is a diagrammatic view of the device 10, and FIGS. 4 to 6 are enlargements of a portion of the device 10 showing the relative positions of the mould 1, the caps 7 and the carrier substrate 12 for different stages of an encapsulation method according to the invention.

The device 10 comprises the mould 1 already described with reference to FIGS. 1 and 2, comprising the polytetrafluoroethylene adhesion layer 6 and carrying caps 7 such that each cap is connected to the common mould via the adhesion layer 6.

Moreover, the device 10 comprises:
- means 13 for holding a carrier substrate 12, for example by clamping or by suction of the carrier substrate 12, said carrier substrate carrying structures 11, a motorized plate 14 arranged in order to move the carrier substrate, held by the holding means 13, along three orthogonal axes X, Y, Z.

means 15 for holding the mould 1, for example by clamping or by suction of the mould 1, and a motorized plate 16 arranged in order to move the mould 1, held by the holding means 15, along the three orthogonal axes X, Y, Z.

The carrier substrate 12 is typically a glass or silicon wafer. Each structure 11 is a microstructure, more particularly a microsystem such as a microelectromechanical system or MEMS. The MEMS 11 comprise for example a sensor, an actuator, or a "released" MEMS (i.e. comprising a movable, unconnected or vibrating part) such as a resonator.

Before applying the caps 7 carried by the mould 1 onto the carrier substrate 12, accurate alignment of the mould 1 and of the carrier substrate 12 in a plane defined by the X and Y axes is controlled by an alignment control device that is preferably independent of the encapsulation device according to the invention, but which in some variants can form part thereof. The mould 1, like the carrier substrate 12, comprises optical markers such as alignment crosses. The alignment control is managed by alignment cross recognition software, the software cooperating with the means for moving the carrier substrate 12 with respect to the caps 7 carried by the mould 1, or the alignment control is carried out manually by a user.

It is considered hereafter that the Z axis is substantially perpendicular to the mould 1 and to the carrier substrate 12 and links the mould 1 to the carrier substrate 12. In the device according to the invention, the plates 14 and 16 are arranged in order to move the mould 1 towards the carrier substrate 12 along the Z axis as shown in FIG. 4, until the caps 7 carried by the mould 1 are applied onto the carrier substrate 12. Thus, by means of these plates 14, 16, the caps 7 carried by the mould are applied onto the carrier substrate 12 by maintaining a certain pressure of the mould 1 and of the caps 7 on the carrier substrate 12. This application is shown in FIG. 5. The plates 14, 16 are micrometric plates with precision of the order of one micron. By means of these plates, the caps 7 are applied onto the carrier substrate 12 so that the concave face of each mould cavity 3 and each cap cavity 8 is oriented towards the carrier substrate 12 so as to cap, encapsulate and protect at least one of structures 11. In other words, each cap 7 is applied onto the carrier substrate 12 so that each structure 11 is encapsulated and protected within a cavity 8.

The device 10 comprises moreover means for bonding the caps 7 onto the carrier substrate when the caps 7 are applied onto the carrier substrate. The bonding means include an emission source 18. During the application of the caps 7 onto the carrier substrate 12 shown in FIG. 5, the caps 7 are thus bonded onto the carrier substrate 12 by means of the seals 9 and the source 18. The bonding thus comprises a weld by seals 9 carried out at low temperature and low pressure, so as not to impair the performance of the microsystems 11.

In the variant in which the seals are eutectic seals, the source 18 emits heat in order to melt the seals 9 so as to weld the caps 7 to the carrier substrate 12. The advantages of eutectic seals are a moderate weld temperature (typically around 300°), very good adhesion and the ability to produce cavities 8 encapsulating the structures 11 in a vacuum.

In the preferred variant in which the seals are polymer seals, the source 18 emits heat and/or an ultraviolet radiation that transforms the seals 9 by changing them from a liquid phase or a viscoelastic phase to a "solid" phase that is crosslinked or gelled by heating and/or exposure to UV radiation, so as to weld the caps 7 to the carrier substrate 12. The polymer seals 9 have very good tolerance to the topography of the carrier substrate 12 and a low welding temperature range from ambient temperature to approximately 250° C. Thus, bonding via a polymer seal limits the risks of melting the adhesion layer 6. On the other hand, polymer seals do not allow vacuum cavities to be produced, as polymers are generally insufficiently hermetic.

The seals 9 have structured parts in some places, so that when the caps 7 are applied onto the carrier substrate 12, these seals 9 are structured at passages for electrical connections linked to the structures 11 and carried by the carrier substrate. Each connection starts from a microstructure 11 and extends to the exterior of the cavity 8 encapsulating the microstructure 11. Apart from the structured parts, the seals 9 have a smooth outer surface and a constant thickness. At the structured parts, the seals 9 have the same thickness as at the non-structured parts, but have a structured outer surface having for example a grid shape or embossing comprising grooves and recesses. When the seals 9 melt during the bonding of the caps 7 to the carrier substrate 12, the lack of material at the embossed recesses compensates for the additional thickness due to the electrical connections.

Finally, the device 10 comprises means for separating the mould 1 and the caps 7, after the caps 7 have been bonded to the carrier substrate 12.

The separation means are arranged in order to mechanically separate the mould and each cap, by pulling the mould 1 from each cap 7. As shown in FIG. 6, the mould 1 and the caps 7 are separated by pulling the mould 1 from the caps 7 by means of motorized plates 16, 14 that pull in opposite directions along the Z axis on the one hand, the mould 1 and on the other hand, the caps 7 bonded to the carrier substrate 12, until mechanical break-away occurs between the adhesion layer 6 and the caps 7. After mechanical break-away, the polytetrafluoroethylene layer 6 remains on the mould substrate 2, and the caps 7 remain bonded to the carrier substrate 12 so as to form a substrate 12 carrying structures 11 encapsulated by caps 7.

Thus a transfer of the caps 7 is carried out from the mould 1 to the carrier substrate 12, using a reusable mould 1. The mould 1 is reusable as the adhesion layer 6 limits the adhesion between the mould 1 and the caps 7, and the adhesion layer 6 thus remains bonded to the mould substrate 2. In order to reuse the mould 1, it is sufficient to deposit new caps 7 in each mould cavity 3, which considerably simplifies encapsulations carried out on an industrial scale.

Moreover, as the mould 1 comprises several cavities 3 and carries several caps 7, it is noted that the encapsulation that has just been described is a collective encapsulation, i.e. a simultaneous encapsulation in parallel of several structures 11 by several cavities 8, which has the advantage of being much faster than a series of successive individual encapsulations over time.

Finally, the encapsulation that has just been described is compatible with the release of the microsystems 11 before their encapsulation, as the carrier substrate 12 is not handled during the making of the caps 7. By release of a microsystem is meant the fact of giving mobility or freedom of movement to the parts of the microsystem that must be mobile or have freedom of movement for its satisfactory operation.

The device 10 finally comprises a fuming nitric acid bath 19, at a concentration of 99%, in which the encapsulated substrate 12 can be dipped by means of the motorized plate 14. Thus, by dipping the substrate 12 carrying the encapsulated structures 11, the caps are cleaned of any small residues of fluorinated polymer that may, unusually, accidentally remain on the caps 7. It is also possible to clean the residues of fluorinated polymer using an oxygen plasma.

A second embodiment of an encapsulation device according to the invention will now be described, implementing a second embodiment of the encapsulation method according to the invention, only in respect of their difference in comparison with the first embodiments of the device and method according to the invention described above. In particular, references 1 to 19 will not be described again.

In this second embodiment, the separation means comprise the fuming nitric acid bath 19 at a concentration of 99%. After the caps 7 have been bonded to the substrate 12, an assembly comprising the mould 1, the caps 7 carried by the mould 1 and bonded to the carrier substrate 12, and the carrier substrate 12, is dipped into the bath 19 by means of the plates 14 and 16. Thus the mould 1 and the caps are separated chemically, by dissolving the adhesion layer 6 in the bath 19.

Of course, the invention is not limited to the examples that have just been described and numerous modifications can be made to these examples without departing from the scope of the invention.

In particular, the seals 9 can be deposited on the carrier substrate 12 around each structure 11 instead of being deposited on the caps 7 around each cap cavity 8.

Moreover, in the description of the figures, the adhesion layer 6 is common to all of the caps 7; in a variant, the mould 1 can comprise separate adhesion layers deposited in each mould cavity 3.

Similarly, instead of using caps 7 separate from each other, the caps can be connected directly to each other and thus be grouped onto a single plate forming several cap cavities 8.

Moreover, the mould 1 can carry only a single cap 7 and only a single cap cavity 8, so as to encapsulate only one structure at once in an individual and localized manner.

Moreover, in the first embodiment, instead of using the motors 14 and 16, the step of pulling off the caps can be implemented for example using a claw system, a lever arm or pneumatic jack, or can be implemented manually by an operator using an equivalent instrument. It is noted moreover that in a variant of the production method of the mould 1, the deposition of the adhesion layer 6 is carried out by spin coating or spray coating of PTFE in liquid phase.

Furthermore, each cap 7 can comprise a polymer such as benzo-cyclo-butene (BCB) or an epoxy resin, particularly of the SU8 type rather than metal. Each cap 7 can also comprise glass or silicon.

Finally, instead of welding using a eutectic or polymer seal, the caps 7 can be bonded to the carrier substrate 12 by means of:
  direct silicon welding, comprising for example the emission of heat by the source 18; this type of welding is applicable if for example each cap 7 and the carrier substrate 12 are made of silicon, or
  anode welding comprising for example the emission of heat by the source 18 and an application of an electrical voltage between each cap 7 and the carrier substrate 12; this type of welding is applicable if for example each cap 7 is made of glass and if the carrier substrate 12 is made of silicon, or
  a thermocompression weld comprising for example the emission of heat by the source 18 and the application of each cap 7 onto the carrier substrate with high pressure; this type of welding is applicable if for example each cap 7 and the carrier substrate 12 all comprise metallic seals made of copper arranged to be superimposed when each cap 7 is applied onto the carrier substrate.

The invention claimed is:

1. A method for the encapsulation of at least one structure (11) carried by a carrier substrate (12), comprising:
  applying the carrier substrate (12), of at least one cap (7) carried by a mold (1, 2, 6), the mold comprising an adhesion layer (6), each cap (7) being in contact with the adhesion layer (6), each cap forming a cap cavity (8); then
  bonding the at least one cap (7) onto the carrier substrate (12); then
  separating the mold (1, 2, 6) and the at least one cap (7), wherein the adhesion layer (6) is made from a fluorinated polymer,
    after separating the mold (1, 2, 6) from the at least one cap (7), each cap (7) is not in contact with the at least one structure (11) that is encapsulated, and
    each cap (7) being separated, by the cap cavity (8), from the at least one structure (11) that is encapsulated.

2. The method according to claim 1, wherein the fluorinated polymer comprises a fluorocarbon polymer or polytetrafluoroethylene.

3. The method according to claim 1, wherein the mold (1, 2, 6) and the at least one cap (7) are separated mechanically, by pulling the mold (1, 2, 6) from the at least one cap (7).

4. The method according to claim 3, wherein the mold (1, 2, 6) comprises a mold substrate (2) in contact with the adhesion layer (6), and in that a break-away force required in order to separate the mold substrate (2) and the adhesion layer (6) is greater than a break-away force required in order to separate the adhesion layer (6) and at the least one cap (7).

5. The method according to claim 1, wherein the mold (1, 2, 6) is separated from the at least one cap (7) chemically, by dissolving the adhesion layer (6).

6. The method according to claim 5, wherein the adhesion layer (6) is dissolved in an acid bath or in a solvent bath (19).

7. The method according to claim 1, wherein the at least one cap (7) is bonded to the carrier substrate (12) by means of a polymer seal (9) or a eutectic seal (9) or thermocompression weld.

8. The method according to claim 7, wherein during the application, the seal is structured at the level of at least one connecting passage linked to at least one structure.

9. The method according to claim 1, wherein the at least one cap is perforated.

10. The method according to claim 1, wherein the mold (1, 2, 6) comprises silicon atoms.

11. The method according to claim 1, wherein each cap (7) comprises a metallic layer in contact with the fluorinated polymer (6).

* * * * *

UNITED STATES PATENT AND TRADEMARK OFFICE
CERTIFICATE OF CORRECTION

PATENT NO.         : 8,617,413 B2
APPLICATION NO.   : 13/056796
DATED              : December 31, 2013
INVENTOR(S)       : Brault et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 277 days.

Signed and Sealed this
Twenty-second Day of September, 2015

Michelle K. Lee
*Director of the United States Patent and Trademark Office*